US010804100B2

(12) United States Patent
Nakatani et al.

(10) Patent No.: US 10,804,100 B2
(45) Date of Patent: Oct. 13, 2020

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kimihiko Nakatani, Toyama (JP); Kenji Kameda, Toyama (JP); Atsushi Sano, Toyama (JP); Tatsuru Matsuoka, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 5 days.

(21) Appl. No.: 16/134,622

(22) Filed: Sep. 18, 2018

(65) Prior Publication Data

US 2019/0096660 A1   Mar. 28, 2019

(30) Foreign Application Priority Data

Sep. 26, 2017   (JP) ................... 2017-185212

(51) Int. Cl.
*H01L 21/02*   (2006.01)
*C23C 16/30*   (2006.01)
(Continued)

(52) U.S. Cl.
CPC ........ *H01L 21/0228* (2013.01); *C23C 16/308* (2013.01); *C23C 16/36* (2013.01);
(Continued)

(58) Field of Classification Search
None
See application file for complete search history.

(56) References Cited

U.S. PATENT DOCUMENTS

2005/0255713 A1 * 11/2005 Taguchi ............... C23C 16/345
438/792
2006/0032442 A1    2/2006 Hasebe
(Continued)

FOREIGN PATENT DOCUMENTS

JP    2006-054432 A    2/2006
JP    2010-153776 A    7/2010
(Continued)

OTHER PUBLICATIONS

Singaporean Search Report and Written Opinion dated May 9, 2019 for the Singaporean Patent Application No. 10201807937W.
(Continued)

*Primary Examiner* — Angel Roman
(74) *Attorney, Agent, or Firm* — Volpe and Koenig, P.C.

(57) ABSTRACT

There is provided a method of forming a film with improved step coverage on a substrate by performing, a predetermined number of times, forming a first layer by supplying a halogen-free precursor having a first chemical bond cut by thermal energy at a first temperature and a second chemical bond cut by thermal energy at a second temperature lower than the first temperature and having a ratio of the number of first chemical bonds to the number of second chemical bonds in one molecule thereof, the ratio being equal to or more than 3, to the substrate at a temperature equal to or higher than the second temperature and lower than the first temperature.

14 Claims, 7 Drawing Sheets

(51) Int. Cl.
*C23C 16/36* (2006.01)
*C23C 16/455* (2006.01)
*C23C 16/52* (2006.01)
*C23C 16/40* (2006.01)

(52) U.S. Cl.
CPC ...... *C23C 16/401* (2013.01); *C23C 16/45525* (2013.01); *C23C 16/45531* (2013.01); *C23C 16/45578* (2013.01); *C23C 16/52* (2013.01); *H01L 21/02126* (2013.01); *H01L 21/02167* (2013.01); *H01L 21/02216* (2013.01); *H01L 21/02219* (2013.01); *H01L 21/02222* (2013.01)

(56) References Cited

U.S. PATENT DOCUMENTS

| | | |
|---|---|---|
| 2007/0260097 A1 | 11/2007 | Senkevich |
| 2010/0105192 A1 | 4/2010 | Akae et al. |
| 2012/0115334 A1 | 5/2012 | Takaba |
| 2013/0210241 A1* | 8/2013 | LaVoie .................. C23C 16/345 438/791 |
| 2015/0187567 A1* | 7/2015 | Ashihara ........... H01L 21/02104 438/758 |

FOREIGN PATENT DOCUMENTS

| | | |
|---|---|---|
| KR | 20120033264 A | 4/2012 |
| KR | 20120108254 A | 10/2012 |
| WO | 2017/158848 A1 | 9/2017 |

OTHER PUBLICATIONS

Korean Office Action dated Aug. 27, 2019 for the Korean Patent Application No. 10-2018-0109033.

Japanese Office Action dated Jun. 16, 2020 for Japanese Patent Application No. 2017-185212.

\* cited by examiner

— First chemical bond
-- Second chemical bond

FIG. 6A

| First chemical bond | Cutting temperature (first temperature) |
|---|---|
| Si — R | 850°C |
| Si — OR | 850°C |

FIG. 6B

| Second chemical bond (broken line) | Cutting temperature (second temperature) |
|---|---|
| Si -- O -- Si | 750°C |
| Si -- N(H) -- Si | 600°C |
| Si -- NR$_2$ | 550°C |
| Si -- H | 500°C |
| Si -- Si | 350°C |

FIG. 7

| Example of Si-containing compound | The number of first chemical bonds | The number of second chemical bonds | Ratio X (the number of first chemical bonds/the number of second chemical bonds) |
|---|---|---|---|
| $R_3Si-SiR_3$ | 6 | 1 | 6 |
| $(OR)_3Si-Si(OR)_3$ | 6 | 1 | 6 |
| $R_3Si-NH-SiR_3$ | 6 | 2 | 3 |
| $(OR)_3Si-NH-Si(OR)_3$ | 6 | 2 | 3 |
| $R_3Si-O-SiR_3$ | 6 | 2 | 3 |
| $(OR)_3Si-O-Si(OR)_3$ | 6 | 2 | 3 |
| $SiHR_3$ | 3 | 1 | 3 |
| $SiH(OR)_3$ | 3 | 1 | 3 |
| $Si(NR_2)R_3$ | 3 | 1 | 3 |
| $Si(NR_2)(OR)_3$ | 3 | 1 | 3 |
| $R_2HSi-O-SiHR_2$ | 4 | 4 | 1 |
| $R_2N-SiH_2-NR_2$ | 0 | 4 | 0 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2017-185212, filed on Sep. 26, 2017, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of forming a film on a substrate is often carried out by supplying a precursor to the substrate.

SUMMARY

Some embodiments of the present disclosure provide a technique capable of improving the step coverage of a film formed on a substrate.

According to one embodiment of the present disclosure, there is provided a technique that forms a film on a substrate by performing, a predetermined number of times, forming a first layer by supplying a halogen-free precursor having a first chemical bond cut by thermal energy at a first temperature and a second chemical bond cut by thermal energy at a second temperature lower than the first temperature and having a ratio of the number of first chemical bonds to the number of second chemical bonds in one molecule thereof, the ratio being equal to or more than 3, to the substrate at a temperature equal to or higher than the second temperature and lower than the first temperature.

BRIEF DESCRIPTION OF DRAWINGS

FIGS. 6A and 6B are tables exemplifying types of first chemical bonds of a precursor and types of second chemical bonds of the precursor, respectively.

FIG. 7 is a table exemplifying types of precursors.

DETAILED DESCRIPTION

Embodiments of the Present Disclosure

Figure 1:
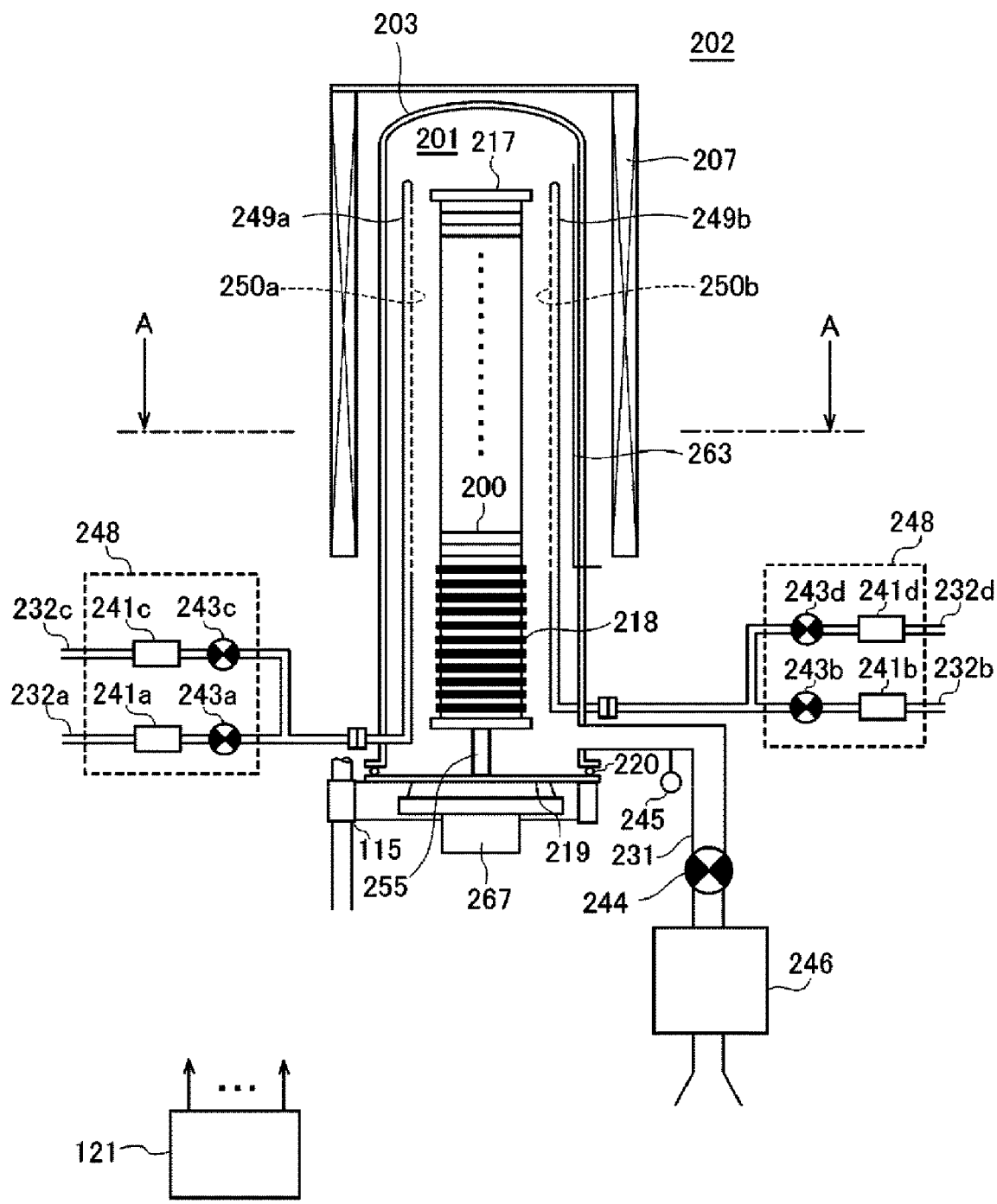
FIG. 1 is a schematic configuration diagram of a vertical process furnace of a substrate processing apparatus suitably used in one embodiment of the present disclosure, in which a portion of the process furnace is shown in a vertical cross section.

One embodiment of the present disclosure will now be described mainly with reference to FIGS. 1 to 4.
(1) Configuration of Substrate Processing Apparatus As shown in FIG. 1, a process furnace 202 includes a heater 207 as a heating mechanism (a temperature adjustment part). The heater 207 has a cylindrical shape and is vertically installed by being supported by a holding plate. The heater 207 functions as an activation mechanism (an excitation part) that thermally activates (excite) a gas.

A reaction tube 203 is arranged inside the heater 207 in a concentric relationship with the heater 207. The reaction tube 203 is made of a heat resistant material such as quartz ($SiO_2$) or silicon carbide (SiC) and is formed in a cylindrical shape with its upper end closed and its lower end opened. A process chamber 201 is formed in the hollow cylindrical portion of the reaction tube 203. The process chamber 201 is configured to accommodate wafers 200 as substrates.

Nozzles 249a and 249b are installed in the process chamber so as to penetrate the lower side wall of the reaction tube 203. Gas supply pipes 232a and 232b are connected to the nozzles 249a and 249b, respectively.

Mass flow controllers (MiFCs) 241a and 241b, which a flow rate controllers (flow ate control parts), and valves 243a and 243b as opening/closing valves are installed in the gas supply pipes 232a and 232b, respectively, sequentially from the upstream side. Gas supply pipes and 232d are connected to the gas supply pipes 232a and 232b, respectively, on the downstream side of the valves 243a and 243b. MFCs 241c and 241d and valves 243c and 243d are installed in the gas supply pipes 232c and 232d, respectively, sequentially from the upstream side.

Figure 2:
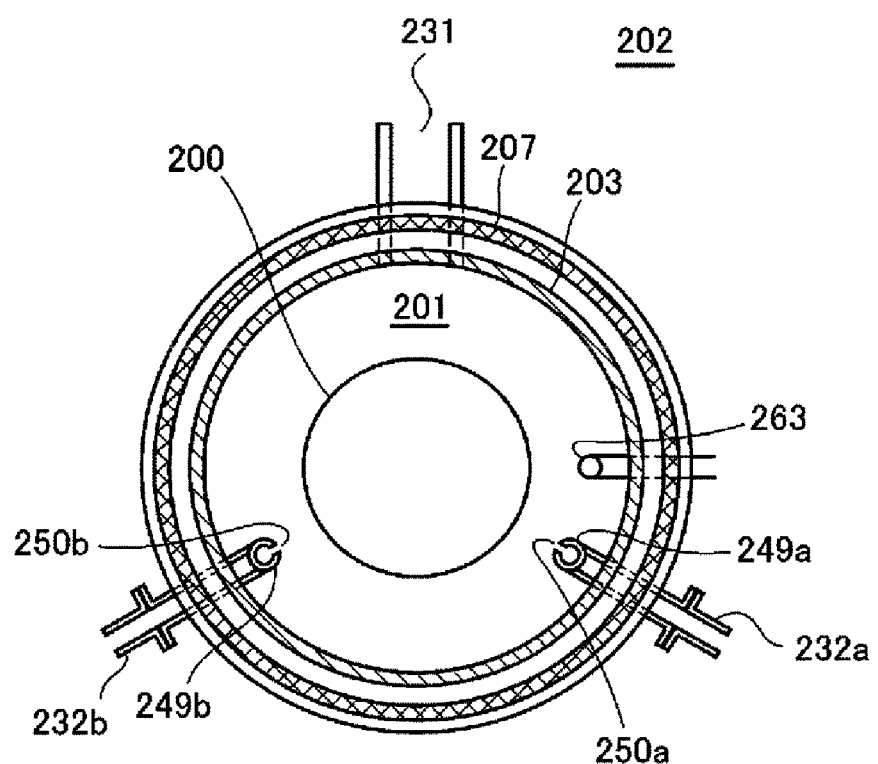
FIG. 2 is a schematic configuration diagram of the vertical process furnace of the substrate processing apparatus suitably used in one embodiment of the present disclosure, in which a portion of the process furnace is shown in a cross section taken along line A-A in FIG. 1.

As shown in FIG. 2, the nozzles 249a and 249b are respectively provided at a space having an annular plan-view shape between the inner wall of the reaction tube 203 and the wafers 200, and are installed so as to extend upward in the arrangement direction of the wafers 200 from a lower portion of the inner wall of the reaction tube 203 to an upper portion thereof. That is, the nozzles 249a and 249b are respectively installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are formed on the side surfaces of the nozzles 249a and 249b, respectively. The gas supply holes 250a and 250b are respectively opened toward the center of the reaction tube 203 so as to allow the gas to be supplied toward the wafers 200. The gas supply holes 250a and 250b are formed in a plural number between the lower portion of the reaction tube 203 and the upper portion of the reaction tube 203.

A halogen-free precursor (precursor gas) having a first chemical bond to be cut by thermal energy at a first temperature and a second chemical bond to be cut by thermal energy at a second temperature lower than the first temperature and having a ratio of the number of first chemical bonds to the number of second chemical bonds in one molecule thereof, the ratio being equal to 3 or more, is supplied from the gas supply pipe 232a into the process chamber 201 via the MFC 241a, the valve 243a and the nozzle 249a. The precursor gas is a gas in a gaseous state, for example, a gas obtained by vaporizing a precursor in a liquid state under room temperature and atmospheric pressure, or a precursor in a gaseous state under room temperature and atmospheric pressure.

FIG. 6A exemplifies the types of first chemical bonds that can be contained in the precursor and their cutting temperature (first temperature). FIG. 6B exemplifies the types of second chemical bonds that can be contained in the precursor and their cutting temperature (second temperature). As shown in FIGS. 6A and 6B, both the first chemical bonds and the second chemical bonds are bonds of silicon (Si), which is a main element constituting a film to be formed, and specific elements. That is, at least one of the bonding elements in each of the first chemical bonds and second chemical bonds contains Si. The cutting temperature (the first temperature and the second temperature) used herein refers to a temperature at which a specific chemical bond (the first chemical bond and the second chemical bond) of a precursor can be cut by heat when the precursor exists alone in the process chamber 201. By heating a precursor having the first chemical bond and the second chemical bond to a predetermined temperature equal to or higher than the second temperature and lower than the first temperature, the first chemical bond can be maintained without being cut and the second chemical bond can be cut to generate an intermediate containing the first chemical bond. In the present disclosure, the ratio of the number of first chemical bonds to the number of second chemical bonds contained in one molecule of the precursor (the number of first chemical bonds/the number of second chemical bonds) is also referred to as a ratio X. By thermally decomposing a precursor having a large ratio X, specifically, a precursor having a ratio X of 3 or more, at the above-mentioned temperature, it is possible to generate an intermediate containing many first chemical bonds.

An example of the precursor having the first chemical bond and the second chemical bond and having the ratio X of 3 or more may include an alkylsilazane compound represented by the structural formula of $R_3Si$—NH—$SiR_3$ (hereinafter also simply referred to as a silazane compound). The silazane compound is a compound having Si and nitrogen (N) as a skeleton. The symbol "R" used herein means an alkyl group such as a methyl group, an ethyl group, a propyl group, an isopropyl group, a butyl group or an isobutyl group. This silazane compound acts not only as a Si source but also as an N source and a C source.

An example of the above-mentioned silazane compound may include hexamethyldisilazane ($[(CH_3)_3Si]_2NH$), abbreviation: HMDSN) gas. Among a plurality of chemical bonds included in HMDSN, a Si—R bond is a bond which is hardly cut at a temperature lower than the first temperature (for example, 850 degrees C.) and is easily cut at a temperature equal to or higher than the first temperature when HMDSN exists alone in the process chamber 201. The Si—R bond corresponds to the first chemical bond. The Si—R bond in HMDSN refers to a Si—C bond in the bond of Si and an alkyl group, that is, a Si—C bond in the bond of Si and a methyl group. Further, among the chemical bonds of HMDSN, a Si—N bond in a Si—NH—Si bond is a bond which is easily cut at a temperature equal to or higher than the second temperature (for example, 600 degrees C.) when HMDSN exists alone in the process chamber 201. The Si—N bond corresponds to the second chemical bond.

Figure 5:
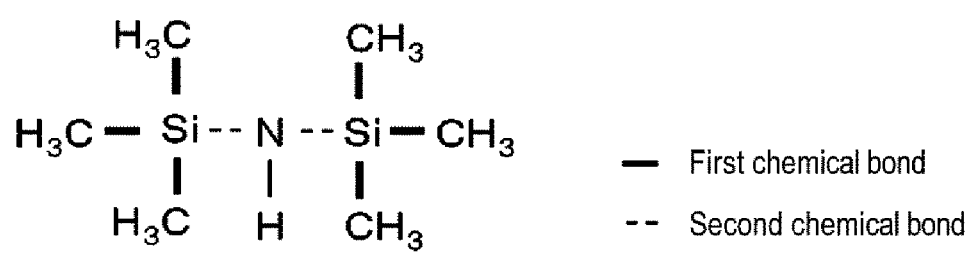
FIG. 5 is a diagram schematically showing a first chemical bond and a second chemical bond of HMDSN.

FIG. 5 schematically illustrates a first chemical bond of a HMDSN molecule, which is indicated by a solid line, and a second chemical bond thereof, which is indicated by a broken line. As illustrated in FIG. 5, HMDSN has six first chemical bonds and two second chemical bonds in one molecule thereof. The value of the ratio X in HMDSN is 3 (=6/2). When such a material having the ratio X of 3 or more is used as a precursor, it is possible to further improve the step coverage of a film formed on the wafer(s) 200, as compared with a case where a material having the ratio X of less than 3 is used as a precursor, as will be described later.

A reactant (reaction gas), for example, an oxygen (O)-containing gas, is supplied from the gas supply pipe 232b into the process chamber 201 via the MFC 241b, the valve 243b and the nozzle 249b. The O-containing gas acts as an oxidizing agent (oxidizing gas), that is, an O source. As the O-containing gas, it may be possible to use, e.g., an oxygen ($O_2$) gas.

A reactant (reaction gas), for example, a hydrogen (H)-containing gas, is supplied from the gas supply pipe 232a into the process chamber 201 via the MFC 241a, the valve 243a and the nozzle 249a. The H-containing gas cannot obtain the oxidizing action by itself. However, the H-containing gas reacts with the O-containing gas under specific conditions to generate an oxidizing species such as atomic oxygen (O), and acts to improve the efficiency of an oxidizing process. Therefore, like the O-containing gas, the H-containing gas may be included in the oxidizing agent. In the present disclosure, the term "oxidizing agent" may include only an O-containing gas or both an O-containing gas and an H-containing gas. As the H-containing gas, it may be possible to use, e.g., a hydrogen ($H_2$) gas.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b and the nozzles 249a and 249b.

A precursor (precursor gas) supply system is mainly constituted by the gas supply pipe 232a, the MFC 241a and the valve 243a. A reactant (O-containing gas) supply system is mainly constituted by the gas supply pipe 232b, the MFC 241b and the valves 243b. A reactant (H-containing gas) supply system is constituted by the gas supply pipe 232a, the MFC 241a and the valve 243a. The O-containing gas supply system functions as an oxidizing agent supply system in a film-forming process to be described later. The H-containing gas supply system may be included in the oxidizing agent supply system. In addition, an inert gas supply system is mainly constituted by the gas supply pipes 232c and 232d, the MFCs 241c and 241d and the valves 243c and 243d.

Either or all of the above-described various supply systems may be configured as an integrated supply system 248 in which the valves 243a to 243d, the MFCs 241a to 241d and the like are integrated. The integrated supply system 248 is connected to each of the gas supply pipes 232a to 232d such that the operations of supplying various gases into the gas supply pipes 232a to 232d, i.e., the opening and closing operation of the valves 243a to 243d and the flow rate adjustment operation by the MFCs 241a to 241d, and the like, are controlled by a controller 121 which will be described later. The integrated supply system 248 is configured as an integral type or division type integrated unit and can be attached to and detached from the gas supply pipes 232a to 232d or the like on an integrated unit basis. Thus, the maintenance, replacement, extension and the like of the integrated supply system 248 can be performed on an integrated unit basis.

An exhaust pipe 231 configured to exhaust the internal atmosphere of the process chamber 201 is connected to the lower side of the side wall of the reaction tube 203. A vacuum pump 246 as a vacuum exhaust device is connected to the exhaust pipe 231 via a pressure sensor 245 as a pressure detector (pressure detecting part), which detects the internal pressure of the process chamber 201, and an auto pressure controller (APC) valve 244 as a pressure regulator (pressure regulating part). The APC valve 244 is configured such that the vacuum-exhaust of the interior of the process chamber 201 and the stop of the vacuum-exhaust can be performed by opening and closing the APC valve 244 while operating the vacuum pump 246 and such that the pressure inside the process chamber 201 can be adjusted by adjusting the opening degree of the APC valve 244 based on the pressure information detected by the pressure sensor 245 while operating the vacuum pump 246. An exhaust system is mainly constituted by the exhaust pipe 231, the APC valve 244 and the pressure sensor 245. The vacuum pump 246 may be included in the exhaust system.

A seal cap 219, which serves as a furnace opening cover configured to airtightly seal the lower end opening of the reaction tube 203, is installed under the reaction tube 203. The seal cap 219 is made of metal such as, e.g., SUS or the like, and is formed in a disc shape. An O-ring 220, which is a seal member that makes contact with the lower end portion of the reaction tube 203, is installed on the upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating mechanism installed outside the reaction tube 203. The boat elevator 215 is configured as a transfer device (transfer mechanism) which loads and unloads (transfers) the wafers 200 into and from the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
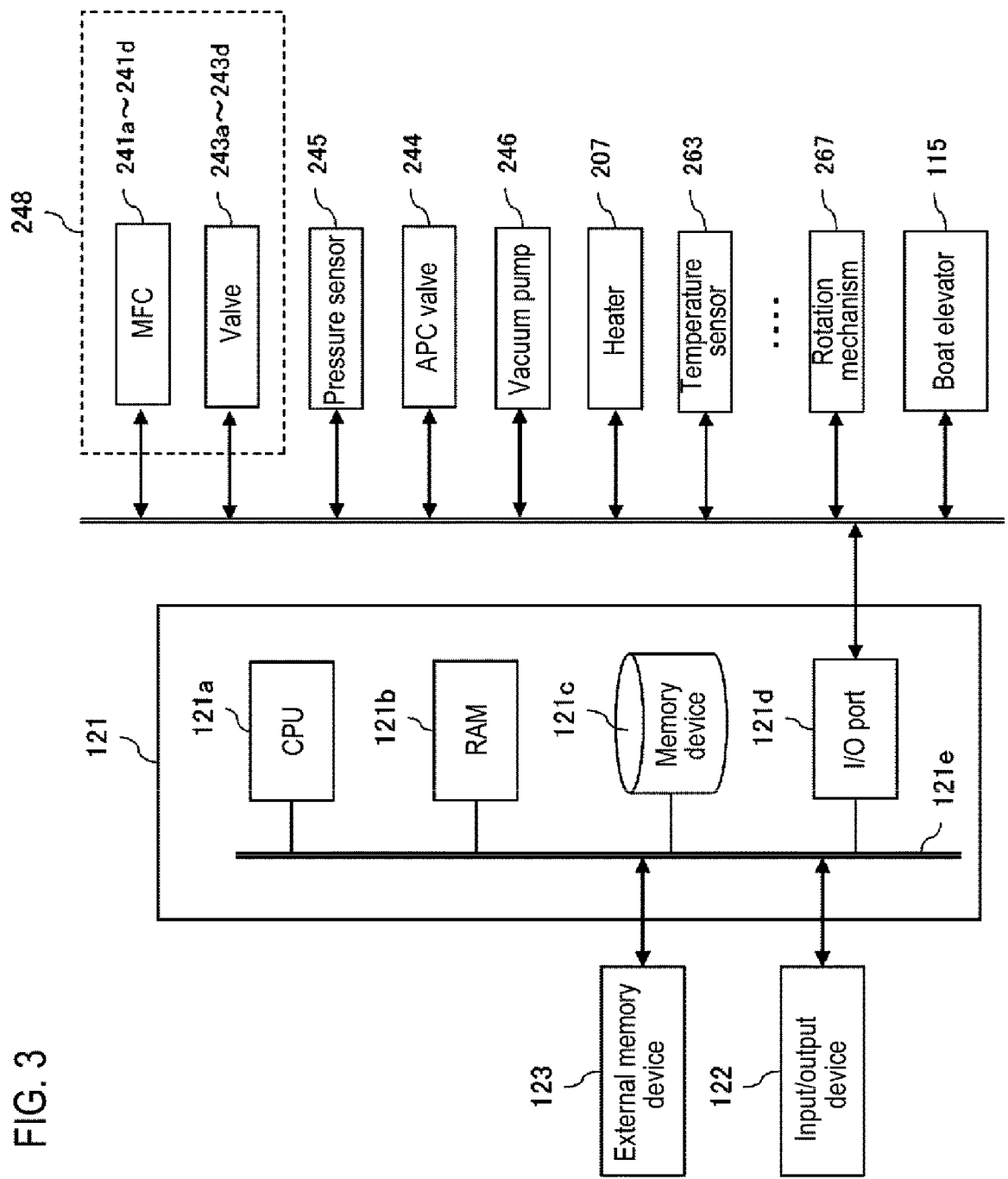
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control unit), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 such as, e.g., a touch panel or the like, is connected to the controller 121.

The memory device 121c is configured with, for example, a flash memory, a hard disk drive (HDD) or the like. A control program for controlling operations of a substrate processing apparatus and a process recipe, in which sequences and conditions of substrate processing to be described later are written, are readably stored in the memory device 121c. The process recipe functions as a program for causing the controller 121 to execute each sequence in the substrate processing process, which will be described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, and so on.

The CPU 121a is configured to read the control program from the memory device 121c and execute the same. The CPU 121a is also configured to read the recipe from the memory device 121c according to an input of an operation command from the input/output device 122. The CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and so on.

The controller 121 may be configured by installing, on a computer, the aforementioned program stored in an external memory device 123 (for example, a magnetic disk such as a hard disk, an optical disk such as a CD or DVD, a magneto-optical disk such as an MO, a semiconductor memory such as a USB memory, or the like). The memory device 121c or the external memory device 123 is configured as a computer-readable recording medium. Hereinafter, the memory device 121c and the external memory device 123 will be generally and simply referred to as a "recording medium". When the term "recording medium" is used herein, it may indicate a case of including only the memory device 121c, a case of including only the external memory device 123, or a case of including both the memory device 121c and the external memory device 123. Alternatively, the program may be supplied to the computer using communication means such as the Internet or a dedicated line, instead of using the external memory device 123.

(2) Substrate Processing Process

A sequence example of forming a film on a wafer 200 as a substrate using the aforementioned substrate processing apparatus, which is one of the processes for manufacturing a semiconductor device, will be described below with reference to FIG. 4. In the following description, the operations of the respective parts constituting the substrate processing apparatus are controlled by the controller 121.

Figure 4:
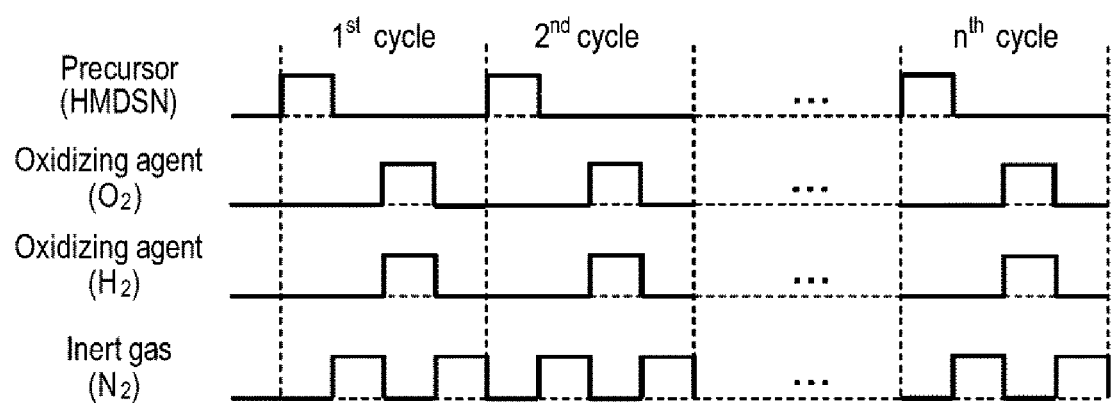
FIG. 4 is a diagram showing a film-forming sequence according to an embodiment of the present disclosure.

In the film-forming sequence shown in FIG. 4, a silicon oxycarbonitride film (SiOCN film) as a film containing Si, O, C and N is formed on the wafer 200 by performing step 1 a predetermined number of times, the step 1 including forming a first layer by supplying an HMDSN gas as a halogen-free precursor having a first chemical bond cut by thermal energy at a first temperature and a second chemical bond cut by thermal energy at a second temperature lower than the first temperature and having a ratio of the number of first chemical bonds to the number of second chemical bonds in one molecule thereof, the ratio being 3 or more, to the wafer 200 at a temperature equal to or higher than the second temperature and lower than the first temperature In addition, the film-forming sequence shown in FIG. 4 further includes step 2 of modifying the first layer by supplying an $O_2$ gas and a $H_2$ gas as reactants to the wafer 200 to form a second layer, and includes performing a cycle a predetermined number of time, the cycle including non-simultaneously performing the step 1 of forming the first layer and the step 2 of forming the second layer.

In the present disclosure, the film-forming sequence shown in FIG. 4 may be expressed as follows for the sake of convenience. The same notation will also be used for film-forming sequences in modifications to be described later.

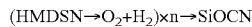

(HMDSN→$O_2$+$H_2$)×n→SiOCN

When the term "wafer" is used in the present disclosure, it may refer to "a wafer itself" or "a wafer and a laminated body of predetermined layers or films formed on a surface of the wafer." When the phrase "a surface of a wafer" is used in the present disclosure, it may refer to "a surface of a wafer itself" or "a surface of a predetermined layer formed on a wafer. When the expression "a predetermined layer is formed on a wafer" is used in the present disclosure, it may mean that "a predetermined layer is directly formed on a surface of a wafer itself" or that "a predetermined layer is formed on a layer formed on a wafer." When the term "substrate" is used in the present disclosure, it may be synonymous with the term "wafer."

(Wafer Charging and Boat Loading)
A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

(Pressure Adjustment and Temperature Adjustment)
The interior of the process chamber 201, namely, a space in which the wafers 200 exist, is vacuum-exhausted (de-pressurization-exhausted) by the vacuum pump 246 so as to reach a desired pressure (degree of vacuum). At this time, the internal pressure of the process chamber 201 is measured by the pressure sensor 245. The APC valve 244 is feedback-controlled based on the measured pressure information. The wafers 200 in the process chamber 201 are heated by the heater 207 to a desired temperature. At this time, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 begins. The actuation of the vacuum pump 246 and the heating and rotation of the wafers 200 may be continuously performed at least until the processing of the wafers 200 is completed.

(Film-forming Step)
Thereafter, the following steps 1 and 2 are sequentially executed.

[Step 1]
In this step, an HMDSN gas is supplied to the wafers 200 in the process chamber 201. Specifically, the valve 243a is opened to allow the HMDSN gas to flow into the gas supply pipe 232a. The flow rate of the HMDSN gas is adjusted by the MFC 241a and the HMDSN gas is supplied into the process chamber 201 via the nozzle 249a and is exhausted from the exhaust pipe 231. At this time, the HMDSN gas is supplied to the wafers 200. At this time, the valves 243c and 243d may be opened to allow an $N_2$ gas to flow into the gas supply pipes 232c and 232d.

Figure 8A:
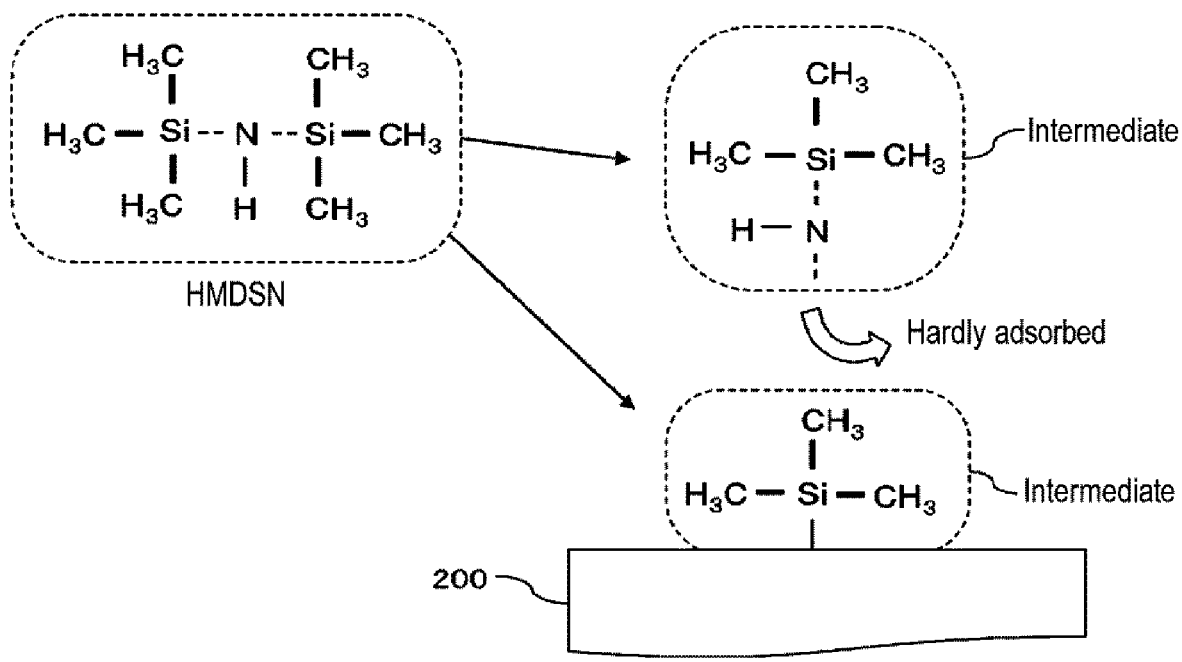
FIGS. 8A and 8B are schematic views showing a state of a film-forcing reaction when HMDSN is used as a precursor and a state of a film-forming reaction when BDEAS is used as a precursor, respectively.

The process conditions of this step are exemplified as follows.
Processing temperature: equal to or higher than second temperature (600 degrees C.) and lover than first temperature (850 degrees C.), specifically 700 to 800 degrees C.
Processing pressure: 1 to 20 Torr (133 to 2,666 Pa)
HMDSN gas supply flow rate: 1 to 2,000 sccm
$N_2$ gas supply flow rate (per gas supply pipe): 0 to 10,000 sccm
Each gas supply time: 1 to 120 seconds, specifically 5 to 60 seconds By supplying the HMDSN gas to the wafers 200 under the above-mentioned conditions, a layer containing Si, C and N (SiCN layer) is formed as a first layer (initial layer) on the outermost surface of the wafer(s) 200. FIG. 8A schematically shows the state of reaction when the first layer is formed on the wafer 200.

As shown in FIG. 8A, under the above-mentioned conditions, the first chemical bond (Si—R bond) contained in HMDSN can be maintained without being cut and the second chemical bond (Si—N bond) can be cut. Then, a first chemical bond-containing intermediate (hereinafter also simply referred to as an intermediate) generated by cutting the second chemical bond and decomposing HMDSN can be adsorbed on the wafer 200. This makes it possible to form the first layer on the wafer 200 under the condition that the surface reaction rate controlling of the intermediate becomes more dominant than the supply rate controlling of the intermediate, specifically under the condition of the surface reaction rate controlling of the intermediate rather than the condition of the supply rate controlling of the intermediate. This is because, by adsorbing an intermediate containing a large proportion of the first chemical bond on the wafer 200, it is possible to terminate the surface of the wafer 200 by the first chemical bond (Si—R bond) which is hardly cut at a temperature lower than the first temperature. The surface of the wafer 200, that is, the surface of the intermediate adsorbed on the wafer 200, is terminated by, for example, an alkyl group (methyl group in this case) to become an inactive (stable) surface in which a dangling bond is hardly generated at least under the above-mentioned processing condition. Therefore, even when another intermediate is supplied to the wafer 200 on which the intermediate containing the first chemical bond is adsorbed, it is possible to suppress further adsorption of another intermediate on the surface of the wafer 200 (the surface of the intermediate terminated by an alkyl group). For this reason, it is possible to form the first layer under the condition that the surface reaction rate controlling of the intermediate becomes more dominant than the supply rate controlling of the intermediate. By forming the first layer under the condition that the surface reaction rate controlling of the intermediate predominates, it is possible to improve the step coverage of the SiOCN film formed on the wafer 200, the wafer in-plane film thickness uniformity and the film thickness controllability of this film. Although FIG. 8A illustrates a state in which an N-free intermediate is adsorbed on the surface of the wafer 200. an N-containing intermediate is also adsorbed on the surface of the wafer 200. Even in this case, the surface of the intermediate is terminated by an alkyl group.

When the processing temperature is lower than the second temperature (600 degrees C.), it is difficult to cut the second chemical bond contained in HMDSN, which may sometimes make it difficult to form the intermediate containing the first chemical bond. This may result in difficulty in forming the first layer on the wafer 200. By setting the processing temperature to a temperature of 600 degrees C. or higher, it is possible to cut the second chemical bond contained in HMDSN and to generate an intermediate containing the first chemical bond. Thus, it makes it possible to form the first layer on the wafer 200, which results in obtaining a practical film formation rate. By setting the processing temperature to a temperature of 700 degrees C. or higher, the effects described here can be more reliably obtained.

In addition, when the processing temperature is equal to or higher than the first temperature (850 degrees C.), it may be difficult to maintain the first chemical bond contained in HMDSN without being cut. As a result, when forming the first layer, the supply rate controlling of the intermediate may become more dominant than the surface reaction rate controlling of the intermediate. By setting the processing temperature to a temperature lower than 850 degrees C., it is possible to maintain the first chemical bond contained in HMDSN without cutting it. This makes it possible to form the first layer in the condition that the surface reaction rate controlling of the intermediate becomes more dominant than the supply rate controlling of the intermediate. As a result, the above-described effects such as improvement of the step coverage of the finally formed SiOCN film can be obtained. By setting the processing temperature to a temperature of 800 degrees C. or lower, the effects described here can be more reliably obtained.

Therefore, it is desirable that the processing conditions (particularly the processing temperature) in the step 1 are set to predetermined conditions within the above-mentioned range. The above-mentioned processing conditions may be the conditions that the surface reaction rate controlling of the intermediate becomes more dominant than the supply rate controlling of the intermediate.

In order to obtain the above-described effects, it is desirable to use a material such as an HMDSN gas having the ratio X of 3 or more as a precursor. When a material having the ratio X of less than 3 is used as a precursor, the first chemical bond contained in the intermediate produced by the decomposition of the precursor may be insufficient. In this case, it is difficult to terminate the surface of the water 200 by the first chemical bond which is hardly cut at a temperature lower than the first temperature, which makes it difficult to form the first layer under the condition that the surface reaction rate controlling of the intermediate becomes more dominant than the supply rate controlling of the intermediate. As a result, it is difficult to obtain the above-described effects such as improvement of the step coverage of the SiOCN film formed on the wafer 200. When a material having only the first chemical bond and not having the second chemical bond, that is, a material having the ratio X of infinity, is used as a precursor, it is difficult to generate an intermediate having the first chemical bond. As a result, it is difficult to form the first layer on the wafer 200, so that it is difficult to obtain a practical film formation rate.

After forming the first layer on the wafer 200, the valve 243a is closed to stop the supply of HMDSN gas into the process chamber 201. Then, the interior of the process chamber 201 is vacuum-exhausted to remove the gas or the like remaining in the process chamber 201 from the interior of the process chamber 201. At this time, the valves 243c and 243d are opened to supply an $N_2$ gas into the process chamber 201. The $N_2$ gas acts as a purge gas.

As the precursor, various silazane compounds other than the HMDSN gas represented by the structural formula of $R_3Si$—NH—$SiR_3$ can be suitably used. As shown in FIG. 7, the silazane compound represented by the above structural formula has six first chemical bonds (Si—R bonds) and two second chemical bonds (Si—N bonds) in one molecule thereof. Since the ratio X in the silazane compound represented by the above structural formula is 3, by using this material as the precursor, it is possible to form the first layer under the condition that the surface reaction rate controlling of the intermediate becomes more dominant than the supply rate controlling of the intermediate. As a result, the effects such as improvement of the step coverage of the finally formed SiOCN film can be obtained.

As the inert gas, in addition to the $N_2$ gas, it may be possible to use, e,g., a rare gas such as an Ar gas, a He gas, a Ne gas, a Xe gas or the like. This is the same as step 2 to be described below.

[Step 2]

After the step 1 is completed, an $O_2$ gas and a $H_2$ gas are separately supplied from different nozzles into the process chamber 201 and are mixed to react with each other in the process chamber 201. Specifically, the valves 243b and 243a are opened to allow the $O_2$ gas and the $H_2$ gas to flow into the gas supply pipes 232b and 232a, respectively. The opening/closing control of the valves 243c and 243d is the same as the opening/closing control of the valves 243c and 243d in the step 1. The flow rates of the $O_2$ gas and the $H_2$ gas flowing in the gas supply pipes 232b and 232a are adjusted by the MFCs 241b and 241a, respectively, and the $O_2$ gas and the $H_2$ gas are supplied into the process chamber 201 via the nozzles 249b and 249a. The $O_2$ gas and the $H_2$ gas are mixed and react with each other in the process chamber 201, and then are exhausted from the exhaust pipe 231. The step 2 includes a period in which the $O_2$ gas and the $H_2$ gas are simultaneously supplied. As will be described later, in this step, only the $O_2$ gas may be supplied into the process chamber 201 without the supply of $H_2$ into the process chamber 201.

The process conditions of this step are exemplified as follows.

Processing pressure: 0.1 to 10 Torr (13.3 to 1,333 Pa)
$O_2$ gas supply flow rate: 100 to 10,000 sccm
$H_2$ gas supply flow rate: 0 to 10,000 sccm
Gas supply time: 1 to 120 seconds
Other processing conditions are the same as the processing conditions in the step 1.

By supplying the $O_2$ gas and the $H_2$ gas into the process chamber 201 under the above-described conditions, the $O_2$ gas and the $H_2$ gas are thermally activated (excited) in a non-plasma manner under a heated and depressurized atmosphere and react with each other, thereby generating a moisture ($H_2O$)-free oxidizing species containing oxygen such as atomic oxygen (O). Then, the first layer formed on the wafer 200 in the step 1 is modified (oxidized) mainly by the oxidizing species. According to this oxidizing process, the oxidizing power can be greatly improved as compared with a case where the $O_2$ gas is supplied alone or a case where the water vapor ($H_2O$ gas) is supplied. That is, by adding the $H_2$ gas to the $O_2$ gas under a depressurized atmosphere, the oxidizing power can be significantly improved as compared with a case where the $O_2$ gas is alone supplied alone or a case where the $H_2O$ gas is supplied.

Since the energy of the oxidizing species generated by the above-described method is higher than the bonding energy of Si—C bond, Si—N bond, Si—H bond and the like contained in the first layer, it is possible to partially cut these bonds contained in the first layer by applying the energy of the oxidizing species to the first layer. C, N, H and the like, which are separated from the bond with from Si, are removed from the first layer. In particular, H in the first layer can be reduced to an impurity level. The dangling bond of Si remaining as a result of the cutting of the bond with C, N, H and the like is linked to O contained in the oxidizing species, thereby forming a Si—O bond. That is, O is introduced into the first layer in the form of Si—O bond.

Although the energy of the oxidizing species is higher than the bonding energy of Si—C bond, Si—N bond and the like contained in the first layer, the above-mentioned conditions include at least the conditions that at least a portion of each of the Si—C bond and the Si—N bond contained in the first layer can be maintained without being cut. That is, the above-mentioned conditions include the conditions with which the oxidation of the first layer by the oxidizing species is performed to unsaturate the first layer (unsaturated oxidation) such that at least a portion of each of the Si—C bond and the Si—N bond contained in the first layer is left as it is. Through this unsaturated oxidation, it is possible to form a second layer containing Si, O, C and N, that is, a silicon oxycarbonitride layer (SiOCN layer), on the wafer 200. The above-mentioned processing conditions may be the conditions that at least a portion of each of the Si—C bond and the Si—N bond contained in the first layer is maintained without being cut.

After forming the second layer on the wafer 200, the valves 243b and 243a are dosed to stop the supply of $O_2$ gas and $H_2$ gas into the process chamber 201, respectively. Then, the gas or the like remaining in the process chamber 201 is removed from the interior of the process chamber 201 by the same processing procedure as in step 1.

As described above, in this step, the $O_2$ gas may be supplied alone into the process chamber 201 without the supply of $H_2$ gas into process chamber 201. That is, in this step, it is possible to use an $O_2$-containing gas such as a nitrous oxide ($N_2O$) gas, a nitrogen monoxide (NO) gas, a nitrogen dioxide ($NO_2$) gas, an $O_2$ gas, a $H_2O$ gas or the like alone as an oxidizing agent. In this case, it is possible to appropriately reduce the oxidizing power in this step and it is easy to include at least a portion of each of the Si—C bond and the Si—N bond contained in the first layer as it is in the second layer.

Further, in this step, it is also possible to use a hydrogen peroxide ($H_2O_2$) gas, an ozone ($O_3$) gas, a plasma excited $O_2$ gas ($O_2^*$), atomic oxygen (O), oxygen radicals ($O^*$), hydroxyl radicals (OH) or the like as the oxidizing agent. When these gases having a relatively strong oxidizing power are used as the oxidizing agent, it is possible to efficiently progress the above-described oxidation as in the case of using the $O_2+H_2$ gas as the oxidizing agent. When the $O_2+H_2$ gas is used as the oxidizing agent, a deuterium ($D_2$) gas or the like can be used instead of the $H_2$ gas.

(Performing Predetermined Number of Times)

A SiOCN film having a desired film thickness can be formed on the wafer 200 by performing a cycle a predetermined number of times (n times, n is an integer of one or more), the cycle including non-simultaneously, i.e., non-synchronously performing steps 1 and 2. This cycle may be repeated multiple times. That is to say, it is desirable that the thickness of the SiOCN layer formed per one cycle is set to be smaller than a desired film thickness, and the cycle described above is repeated a plurality of times until the film thickness of a SiOCN film formed by laminating the second layers becomes equal to the desired film thickness.

(After-Purge Step and Atmospheric Pressure Returning Step)

After the film-forming step is completed, a $N_2$ gas is supplied into the process chamber 201 from each of the gas supply pipes 232c and 232d and is exhausted from the exhaust pipe 231. Thus, the interior of the process chamber 201 is purged, and the gas and the reaction byproducts remaining in the process chamber 201 are removed from the interior of the process chamber 201 (after-purge). Thereafter, the internal atmosphere of the process chamber 201 is substituted with an inert gas (inert gas substitution) and the internal pressure of the process chamber 201 is returned to an atmospheric pressure (return to atmospheric pressure).

(Boat Unload and Wafer Discharge)

Thereafter, the seal cap 219 is moved down by the boat elevator 115 to open the lower end of the reaction tube 203. The processed wafers 200 supported by the boat 217 are unloaded from the lower end of the reaction tube 203 to the outside of the reaction tube 203 (boat unload). The processed wafers 200 are discharged from the boat 217 (wafer discharge).

(3) Effects According to the Present Embodiment

According to the present embodiment, one or more effects set forth below may be achieved.

(a) In the step 1, by supplying a halogen-free HMDSN gas having a first chemical bond and a second chemical bond and having a ratio X of 3 or more to the wafer 200 at a temperature equal to or higher than the second temperature and lower than the first temperature, it is possible to include the first chemical bond in an intermediate produced by decomposition of the HMDSN gas. This makes it possible to progress the formation of the first layer under the condition that the surface reaction rate controlling of the intermediate becomes more dominant than the supply rate controlling of the intermediate. As a result, it is possible to improve the step coverage of the SiOCN film formed on the wafer 200, the wafer in-plane film thickness uniformity, or the film thickness controllability of the film. Such a film-forming method is particularly effective when the underlying surface for the film-forming process has a 3D structure such as a line and space shape, a hole shape, a fin shape or the like.

Figure 8B:
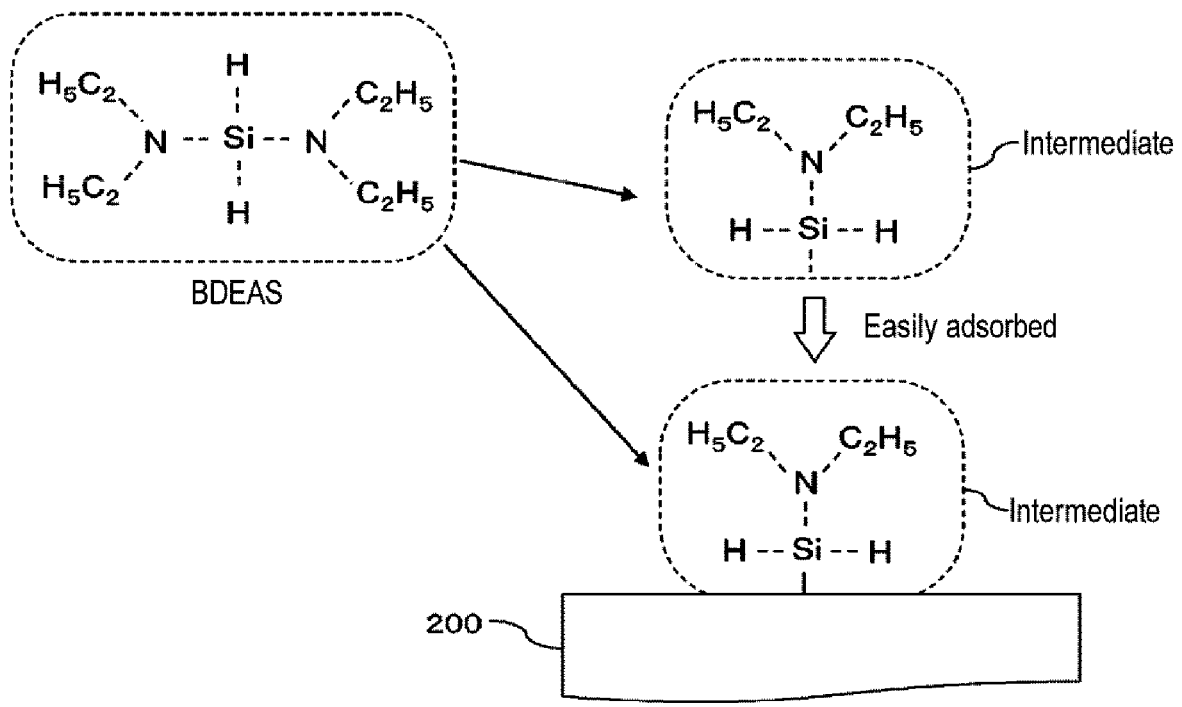

In a case where a material whose ratio X is less than 3 is used as a precursor, the above-described effects may be hardly obtained. For example, when a bis(diethylamino)silane ($SiH_2[N(C_2H_5)_2]_2$, abbreviation: BDEAS) gas having no first chemical bond but only the second chemical bond and having the ratio X of zero is used as the precursor, an intermediate produced by decomposition of the precursor has no first chemical bond. As shown in FIG. 8B, the surface of the wafer 200 on which such an intermediate is adsorbed is terminated by the second chemical bond which is easy to be cut at a temperature equal to or higher than the second temperature, and thus becomes an active (unstable) surface which is likely to generate a dangling bond. In this state, when another intermediate is supplied to the wafer 200, new adsorption of another intermediate may proceed on the surface of the wafer 200. That is, it may be difficult to progress the formation of the first layer in the step 1 under the condition that the surface reaction rate controlling of the intermediate becomes more dominant than the supply rate controlling of the intermediate. As a result, it may be difficult to obtain the above-described effects such as improvement of the step coverage of the finally formed SiOCN film.

(b) In the step 1, by supplying a halogen-free HMDSN gas having the first chemical bond and the second chemical bond and having the ratio X of 3 or more to the wafer 200 at a temperature equal to or higher than the second temperature and lower than the first temperature, it is possible to cut the second chemical bond in the HMDSN gas and thermally decompose the gas to produce an intermediate having the first chemical bond. In this way, by thermally decomposing the HMDSN gas, the formation of the first layer on the wafer 200 can be promoted, and the film formation rate of the SiOCN film formed on the wafer 200 can be increased up to a practical rate.

(c) In the step 1, it is unnecessary to add a reactant, a catalyst or the like to the precursor, and the precursor can be supplied under the non-plasma atmosphere. According to the present embodiment, it is possible to realize a condition where the surface reaction rate controlling of the intermediate becomes more dominant than the supply rate controlling of the intermediate, only by the temperature conditions, so that the control of the film-forming process can be simplified and the costs of the substrate processing can be reduced.

(d) By adopting an alternate supply method in which the steps 1 and 2 are non-simultaneously performed a predetermined number of times, as compared with a case of adopting a simultaneous supply method in which the steps 1 and 2 are simultaneously performed a predetermined number of times, it is possible to further improve the step coverage of the finally formed SiOCN film, the in-plane film thickness uniformity and the film thickness controllability.

(e) By using a Cl-free HMDSN gas as the precursor, it is possible to avoid Cl from being mixed into the SiOCN film formed on the wafer 200. This makes it possible to make the SiOCN film formed on the wafer 200 as a high quality film excellent in, for example, ashing resistance and etching resistance.

(f) The above-described effects can be also obtained in a case of using the aforementioned precursors other than the HMDSN gas, a case of using an oxidizing agent other than the $O_2+H_2$ gas, or a case of using the above-mentioned inert gases other than the $N_2$ gas.

(4) Modifications

The sequence of the film-forming process in this embodiment is not limited to the aspect shown in FIG. 4 but may be modified as the following modifications. Further, the modifications may be combined arbitrarily. Unless otherwise specified, the processing procedures and processing conditions in each step of each modification are the same as the processing procedures and processing conditions in each step of the above-described substrate processing sequence.

(Modification 1)

As shown in FIG. 6A, the first chemical bond of a precursor includes at least one selected from the group of a Si—C bond in the bond of Si and an alkyl group (R) and a Si—O bond in the bond of Si and an alkoxy group (OR). That is, as the first chemical bond, a precursor containing at least one of these bonds may be used. The alkoxy group mentioned here is a monovalent functional group represented by the structural formula of —OR, which is structured by bonding an alkyl group (R) to the oxygen atom (O).

As shown in FIG. 6B, the second chemical bond of the precursor includes at least one selected from the group of a Si—O bond in a Si—O—Si bond, a Si—N bond in a Si—NH—Si bond, a Si—N bond in the bond of Si and an amino group ($NR_2$), a Si—H bond and a Si—Si bond. That is, as the second chemical bond, a precursor containing at least one of these bonds may be used. The amino group mentioned here is a monovalent functional group represented by the structural formula of —$NR_2$, which is structured by bonding an alkyl group (R) to the nitrogen atom (N).

That is, as the precursor, in addition to the above-mentioned alkylsilazane compound represented by the structural formula of $R_3Si$—NH—$SiR_3$, it is possible to suitably use a compound having the ratio X of 3 or more among the various Si-containing compounds represented by the structural formula shown in FIG. 7.

For example, as shown in FIG. 7, the alkylsilane compound represented by the structural formula of $R_3Si$—$SiR_3$ or the alkoxysilane compound represented by the structural formula of $(OR)_3Si$—Si $(OR)_3$ has the ratio X of 6. Therefore, a silicon oxycarbide film (SiOC film) or the like may be formed on the wafer 200 by using these Si-containing compounds as precursors. In this case, when forming the first layer, it becomes easy to create a condition that the surface reaction rate controlling of the intermediate becomes more dominant than the supply rate controlling of the intermediate, so that the above-described effects such as improvement of the step coverage of a film formed on the wafer 200 can be more certainly achieved.

In addition, for example, an alkoxysilazane compound represented by the structural formula of $(OR)_3Si$—NH—Si $(OR)_3$, an alkylsiloxane compound represented by the structural formula of $R_3Si$—O—$SiR_3$, an alkoxysiloxane compound represented by the structural formula of $(OR)_3Si$—O—$Si(OR)_3$, an alkylsilane compound represented by the structural formula of $SiHR_3$, an alkoxysilane compound represented by the structural formula of $SiH(OR)_3$, an alkylaminosilane compound represented by the structural formula of $Si(NR_2)R_3$, and an alkoxyaminosilane compound represented by the structural formula of $Si(NR_2)(OR)_3$ have the ratio X of 3. Therefore, a SiOC film or a SiOCN film may be formed on the wafer 200 by using these Si-containing compounds as precursors. In these cases, when forming the first layer, a condition that the surface reaction rate controlling of the intermediate becomes more dominant than the supply rate controlling of the intermediate can be created in the same manner as in the case where the silazane compound represented by the structural formula of $R_3Si$—NH—$SiR_3$ is used as the precursor, so that the same effects as the film-forming sequence shown in FIG. 4 can be obtained.

As shown in FIG. 7, the alkylsiloxane compound represented by the structural formula of $R_2HSi$—O—$SiHR_2$ and the alkylsilazane compound represented by the structural formula of $R_2N$—$SiH_2$—$NR_2$ have the ratio X of less than 3. Therefore, when these Si-containing compounds are used as precursors, it is difficult to create a condition that the surface reaction rate controlling of the intermediate becomes more dominant than the supply rate controlling of the intermediate when forming the first layer, which makes it difficult to obtain the same effects as the film-forming sequence shown in FIG. 4.

(Modification 2)

Although the halogen-free Si-containing compound is exemplified in FIG. 7, even in a case where the Si-containing compound contains halogen, if the Si-containing compound has the first chemical bond and the second chemical bond and has the ratio X of 3 or more, it can be used as the precursor. As a result, the same effects as the film-forming sequence shown in FIG. 4 can be obtained.

(Modification 3)

Although it has been illustrated in FIG. 4 that a film is formed on the wafer 200 by performing a cycle a predetermined number of times, the cycle including non-simultaneously performing the steps 1 and 2, the step 2 may be omitted. That is, the film may be formed on the wafer 200 by performing the step 1 a predetermined number of times (once or more). When the step 1 is performed a predetermined number of times, a halogen-free HMDSN gas having the first chemical bond and the second chemical bond and having the ratio X of 3 or more is supplied to the wafer 200 at a temperature equal to or higher than the second temperature and lower than the first temperature. This makes it possible to form a SiCN film on the wafer 200 under the condition that the surface reaction rate controlling of the intermediate becomes more dominant than the supply rate controlling of the intermediate. As a result, it is possible to improve the step coverage of the finally formed SiCN film, the in-plane film thickness uniformity, the film thickness controllability, and the like.

(Modification 4)

Although it has been illustrated in FIG. 4 that an oxidizing agent is used as a reactant, a nitriding agent may be used as the reactant. As the nitriding agent, it may be possible to use a hydrogen nitride-based gas such as an ammonia ($NH_3$) gas, a hydrazine ($N_2H_4$) gas, a diazene ($N_2H_2$) gas, a $N_3H_8$ gas or the like. In this case, a SiCN film or a SiOCN film can be formed on the wafer 200 by, for example, the following film-forming sequences. According to this modification, the same effects as the film-forming sequence shown in FIG. 4 can be obtained.

(HMDSN→$NH_3$)×n⇒SiCN

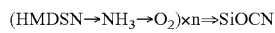

(HMDSN→$NH_3$→$O_2$)×n⇒SiOCN

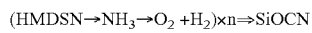

(HMDSN→$NH_3$→$O_2$ +$H_2$)×n⇒SiOCN

Other Embodiments

While some embodiments of the present disclosure have been specifically described above, the present disclosure is not limited to the aforementioned embodiments but may be differently modified without departing from the subject matter of the present disclosure.

For example, it has been described in the above-described embodiments and modifications that a reactant is supplied after a precursor is supplied. However, the present disclosure is not limited thereto, but the order of supplying, the precursor and reactant may be reversed. That is, the precursor may be supplied after the reactant is supplied. By changing the supply order, it is possible to change the film quality and the composition ratio of a film to be formed.

Recipes used in substrate processing may be prepared individually according to the processing contents and may be stored in the memory device 121c via a telecommunication line or the external memory device 123. Moreover, at the start of the substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium in which the recipes are recorded. In addition, the existing recipes already installed in the substrate processing apparatus may be directly modified by operating the input/output device 122 of the substrate processing apparatus.

The example in which film is formed using a batch-type substrate processing apparatus that processes a plurality of substrates at a time has been described in the above embodiments. The present disclosure is not limited to the above embodiments but may be appropriately applied to, for example, a case where the film is formed using a single-wafer-type substrate processing apparatus that processes a single substrate or several substrates at a time. In addition, the example in which the film is formed by using a substrate processing apparatus provided with a hot-wall-type process furnace has been described in the above embodiments. The present disclosure is not limited to the above embodiments but may be appropriately applied to a case where films are formed using a substrate processing apparatus provided with a cold-wall-type process furnace.

Even in the case of using these substrate processing apparatuses, film formation can be performed under the same processing procedures and processing conditions as in the above-described embodiments and modifications and the same effects as those of the above embodiments and modifications can be obtained.

In addition, the embodiments and modifications described above can be used in appropriate combination. The processing procedures and processing conditions at this time can be the same as the processing procedures and processing conditions of the above-described embodiments and modifications.

According to the present disclosure in some embodiments, it is possible to improve the step coverage of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

forming a film on a substrate by performing, a predetermined number of times, forming a first layer by supplying a halogen-free precursor having a first chemical bond cut by thermal energy at a first temperature and a second chemical bond cut by thermal energy at a second temperature lower than the first temperature and having a ratio of the number of first chemical bonds to the number of second chemical bonds in one molecule thereof, the ratio being equal to or more than 3, to the substrate at a temperature equal to or higher than the second temperature and lower than the first temperature under a non-plasma atmosphere, wherein in the act of forming the first layer, the first chemical bond is maintained without being cut and the second chemical bond is cut.

2. The method of claim 1, wherein an intermediate containing the first chemical bond and being produced by decomposing the precursor is adsorbed on the substrate, in the act of forming the first layer.

3. The method of claim 1, wherein the precursor is supplied under the condition that surface reaction rate controlling becomes more dominant than supply rate controlling, in the act of forming the first layer.

4. The method of claim 1, wherein the precursor is supplied under the condition that surface reaction rate controlling of an intermediate containing the first chemical bond and being produced by decomposing the precursor becomes more dominant than supply rate controlling of the intermediate containing the first chemical bond and being produced by decomposing the precursor, in the act of forming a first layer.

5. The method of claim 1, wherein the precursor is supplied under a surface reaction rate controlling condition, in the act of forming the first layer.

6. The method of claim 1, wherein the precursor is supplied under a surface reaction rate controlling condition of an intermediate containing the first chemical bond and being produced by decomposing the precursor, in the act of forming the first layer.

7. The method of claim 1, wherein the first chemical bond includes at least one selected from the group of a Si—C bond in a bond of silicon and an alkyl group and a Si—O bond in a bond of silicon and an alkoxy group.

8. The method of claim 1, wherein the second chemical bond includes at least one selected from the group of a Si—O bond in a Si—O—Si bond, a Si—N bond in a Si—NH—Si bond, a Si—N bond in a bond of silicon and an amino group, a Si—H bond and a Si—Si bond.

9. The method of claim 1, further comprising forming a second layer by supplying a reactant to the substrate to modify the first layer,
wherein the act of forming the film includes performing a cycle the predetermined number of times, the cycle including non-simultaneously performing the act of forming the first layer and the act of forming the second layer.

10. The method of claim 9, wherein the first chemical bond includes at least one selected from the group of a Si—C bond in a bond of silicon and an alkyl group and a Si—O bond in a bond of silicon and an alkoxy group.

11. The method of claim 10, wherein an intermediate containing the first chemical bond and being produced by decomposing the precursor is adsorbed on the substrate, and a surface of the intermediate adsorbed on the substrate is terminated by an alkyl group, in the act of forming the first layer.

12. The method of claim 11, wherein the surface of the intermediate adsorbed on the substrate is terminated by an alkyl group to suppress further adsorption of another intermediate on the surface of the intermediate, in the act of forming the first layer.

13. The method of claim 9, wherein the first chemical bond includes a Si—C bond in a bond of silicon and an alkyl group,
wherein the second chemical bond includes a Si—N bond in a Si—NH—Si bond, and
wherein the reactant includes an oxidizing agent.

14. The method of claim 13, wherein the first layer is a layer containing silicon, carbon and nitrogen,
wherein the second layer is a layer containing silicon, oxygen, carbon and nitrogen, and
wherein the film is a film containing silicon, oxygen, carbon and nitrogen.

* * * * *